United States Patent
Ishiguro et al.

(10) Patent No.: US 7,638,939 B2
(45) Date of Patent: Dec. 29, 2009

(54) LIGHT-EMITTING DEVICE AND ELECTRONIC APPARATUS

(75) Inventors: Hideto Ishiguro, Shiojiri (JP); Tsukasa Eguchi, Showa-machi (JP)

(73) Assignee: Seiko Epson Corporation, Tokyo (JP)

( * ) Notice: Subject to any disclaimer, the term of this patent is extended or adjusted under 35 U.S.C. 154(b) by 394 days.

(21) Appl. No.: 11/613,573

(22) Filed: Dec. 20, 2006

(65) Prior Publication Data
US 2008/0018243 A1   Jan. 24, 2008

(30) Foreign Application Priority Data
Jan. 13, 2006   (JP)   ............ 2006-005770

(51) Int. Cl.
*H05B 33/00* (2006.01)
(52) U.S. Cl. .............. 313/504; 313/506; 313/113
(58) Field of Classification Search ............ None
See application file for complete search history.

(56) References Cited

U.S. PATENT DOCUMENTS

| | | | |
|---|---|---|---|
| 5,804,918 A | 9/1998 | Yazawa et al. | |
| 7,161,184 B2 | 1/2007 | Miyagi et al. | |
| 7,375,464 B2 * | 5/2008 | Chin et al. | 313/506 |
| 7,456,568 B2 * | 11/2008 | Shin | 313/509 |
| 2003/0127974 A1 * | 7/2003 | Miyazawa | 313/504 |
| 2005/0116632 A1 * | 6/2005 | Funamoto et al. | 313/506 |
| 2005/0174047 A1 * | 8/2005 | Shin | 313/505 |
| 2006/0022587 A1 * | 2/2006 | Jeong et al. | 313/504 |
| 2007/0257602 A1 | 11/2007 | Miyagi et al. | |

FOREIGN PATENT DOCUMENTS

| | | |
|---|---|---|
| JP | A 08-321380 | 12/1996 |
| JP | A-9-134788 | 5/1997 |
| JP | B2 2797883 | 9/1998 |
| JP | A 2003-114626 | 4/2003 |
| JP | A 2003-288983 | 10/2003 |
| JP | A-2004-79427 | 3/2004 |
| JP | A-2005-31645 | 2/2005 |
| JP | A-2005-38651 | 2/2005 |
| JP | A-2005-202094 | 7/2005 |

* cited by examiner

*Primary Examiner*—Ashok Patel
(74) *Attorney, Agent, or Firm*—Oliff & Berridge, PLC

(57) ABSTRACT

A light-emitting device includes an organic insulating layer lying above a face of a substrate, reflective layers lying on a face of the organic insulating layer, an inorganic insulating layer lying over the reflective layers, and light-emitting elements arranged above the reflective layers with the inorganic insulating layer disposed therebetween. The light-emitting elements are arranged in array and each reflective layer overlaps a group of the light-emitting elements when viewed from above. An electronic apparatus includes the light-emitting device.

18 Claims, 7 Drawing Sheets

LIGHT-EMITTING DEVICE AND ELECTRONIC APPARATUS

BACKGROUND

1. Technical Field

The present invention relates to a light-emitting device and an electronic apparatus.

2. Related Art

In recent years, electroluminescent (EL) devices including EL elements which are self-luminous and which serve as pixels have been being developed. Japanese Unexamined Patent Application Publication No. 2003-114626 (hereinafter referred to as Patent Document 1) discloses a light-emitting element for light-emitting devices. The light-emitting element includes an insulating layer; thin-film transistors (TFTs) arranged on the insulating layer; an interlayer insulating layer which is made of an organic resin and which lies over the TFTs; and a light-emitting layer which is sandwiched between a pair of electrodes, which is disposed above the interlayer insulating layer, and which contains an organic compound.

Patent Document 1 describes that the organic resin is moisture-permeable and absorbs water and the organic compound, which may have low or high molecular weight, is disadvantageous in being extremely susceptible to oxygen and moisture and therefore is readily deteriorated. An anode or cathode included in the light-emitting element contains an alkali metal or an alkaline-earth metal, which are readily oxidized by oxygen. That is, water or moisture degrades the light-emitting element to cause defects such as dark spots.

Patent Document 1 also discloses a light-emitting device including an insulating layer, a light-emitting element, and an inorganic insulating layer principally containing silicon and nitrogen or a carbon layer which has sp3 bonds and which contains hydrogen, the inorganic insulating or carbon layer being disposed between the insulating layer and the light-emitting element.

The light-emitting device disclosed in Patent Document 1 is a bottom emission type of organic EL device in which light emitted from a light-emitting layer is extracted through an element substrate. On the other hand, a top emission type of organic EL device in which light is extracted from the side opposite to an element substrate has been recently being developed.

FIG. 8A is a plan view of a conventional light-emitting device. FIG. 8B is a sectional view of the conventional light-emitting device taken along the line VIIIB-VIIIB of FIG. 8A. FIG. 9 is a sectional view of the conventional light-emitting device taken along the line IX-IX of FIG. 8A. The conventional light-emitting device is a top emission type of organic EL device. With reference to FIG. 8B, the conventional light-emitting device includes an element substrate 2 and reflective layers 27 arranged thereabove. An inorganic insulating layer 25 similar to that disclosed in Patent Document 1 lies between the reflective layers 27 and pixel electrodes 23.

Light emitted from the light-emitting layer 60 has a broad spectrum and is not bright. Therefore, a display unit including the light-emitting device has a problem that sufficient color reproducibility cannot be achieved. Japanese Patent No. 2797883 (hereinafter referred to as Patent Document 2) discloses an organic EL device having optical resonant structures. In the organic EL device, light emitted from a light-emitting layer travels between reflective layers 27 and a common electrode 50. A portion of the light that has a resonant wavelength corresponding to the optical distance therebetween is extracted in an amplified manner. The extracted light portion is very bright and has a sharp spectrum. When light-emitting elements include respective pixel electrodes 23 having different thicknesses, that is, when the optical distances between the common electrode 50 and the reflective layers 27 are different, from each other, lights having wavelengths corresponding to red, green, and blue can be extracted.

In the conventional light-emitting device, as shown in FIG. 8A, a crack 90 is initiated at a corner of one of the reflective layers 27 to propagate along end portions of this reflective layer 27 in some cases. With reference to FIG. 9, the crack 90 propagates through the inorganic insulating layer 25 and one of the pixel electrodes 23. The crack 90 is probably caused because the following stresses are concentrated on the end portions of this reflective layer 27: residual stresses created during the formation of an organic insulating layer 284, the reflective layers 27, the inorganic insulating layer 25, and the pixel electrodes 23; thermal stresses caused by differences in thermal expansion between these layers and electrodes; and other stresses. The presence of the crack 90 propagating through the inorganic insulating layer 25 and this pixel electrode 23 allows moisture contained in the organic insulating layer 284 to be diffused into an organic EL light-emitting element 3. This causes a problem that defects called dark spots arise.

In the above organic EL device, when the pixel electrodes 23 have different thicknesses such that optical resonant conditions are satisfied, the dark spots are frequently formed in blue light-emitting elements 3B included in the organic EL device. This is probably because the pixel electrodes 23 included in the blue light-emitting elements have the smallest thickness and therefore have the lowest cracking resistance, In order to satisfy the optical resonant conditions, an inorganic insulating layer included in the organic EL device needs to have an extremely small thickness. Hence, it is difficult to prevent the formation of cracks by increasing the thickness of the inorganic insulating layer.

SUMMARY

The present invention has been made to solve the above problem. An advantage of an aspect of the invention is that the following device is provided: a light-emitting device including an inorganic insulating layer and pixel electrodes that are hardly cracked. An advantage of another aspect of the invention is that an electronic apparatus having high reliability is provided.

A light-emitting device according to the present, invention includes an organic insulating layer lying above a face of a substrate, reflective layers lying on a face of the organic insulating layer, an inorganic insulating layer lying over the reflective layers, and light-emitting elements arranged above the reflective layers with the inorganic insulating layer disposed therebetween. The light-emitting elements are arranged in array and each reflective layer overlaps a group of the light-emitting elements when viewed from above. According to this configuration, the number of the corners and end portions of the reflective layers is small; hence, cracks can be prevented from being formed in the inorganic insulating layer.

In the light-emitting device, it is preferable that the light-emitting elements emit different color lights, one of the light-emitting elements of the group emit a blue light, and the other light-emitting elements of the group emit different color lights other than the blue light and be each arranged on both sides of this light-emitting element. According to this configuration, this light-emitting element emitting the blue light is not located close to the corners of the reflective layers; hence, cracks can be prevented from being formed in the inorganic insulating layer.

In the light-emitting device, the reflective layers are preferably arranged over the face of the inorganic insulating layer. According to this configuration, the number of the corners and end portions of the reflective layers is small; hence, cracks can be prevented from being formed in the inorganic insulating layer.

In the light-emitting device, it is preferable that the inorganic insulating layer have contact holes extending therethrough and the reflective layers extend over the walls and bottoms of the contact holes. According to this configuration, since the reflective layers are arranged over the inorganic insulating layer, moisture can be prevented from being released from the organic insulating layer.

In the light-emitting device, the reflective layers preferably have openings extending from the contact holes through the reflective layers and the inorganic insulating layer. According to this configuration, cracks can be prevented from being formed in portions of the inorganic insulating layer that are located close to the openings.

In the light-emitting device, the inorganic insulating layer is preferably formed by an anodic oxidation process using the reflective layers as electrodes. According to this technique, the inorganic insulating layer can be formed over the reflective layers so as to be dense and so as to have very few defects. Furthermore, the manufacturing cost of the inorganic insulating layer can be reduced.

The light-emitting device preferably further includes a common electrode shared by the light-emitting elements. The reflective layers are preferably connected electrically to the common electrode. According to this configuration, the conductive of the common electrode can be enhanced. Furthermore, no auxiliary electrode needs to be placed on the common electrode. This leads to a reduction in manufacturing cost.

In the light-emitting device, the light-emitting elements may include a light-emitting layer containing an organic substance. This configuration is effective in preventing the formation of cracks; hence, moisture can be prevented from being released from the organic insulating layer. This prevents the degradation of the light-emitting elements.

An electronic apparatus according to the present invention includes the light-emitting device. Since cracks can be prevented from being formed in the light-emitting device, the electronic apparatus has high reliability.

BRIEF DESCRIPTION OF THE DRAWINGS

The present invention will be described with reference to the accompanying drawings, wherein like numbers reference like elements.

DESCRIPTION OF EXEMPLARY EMBODIMENTS

Embodiments of the present invention will now be described with reference to the accompanying drawings. In order to provide a clear understanding of the drawings, the size of each component varies for each drawing.

First Embodiment

Figure 1A:
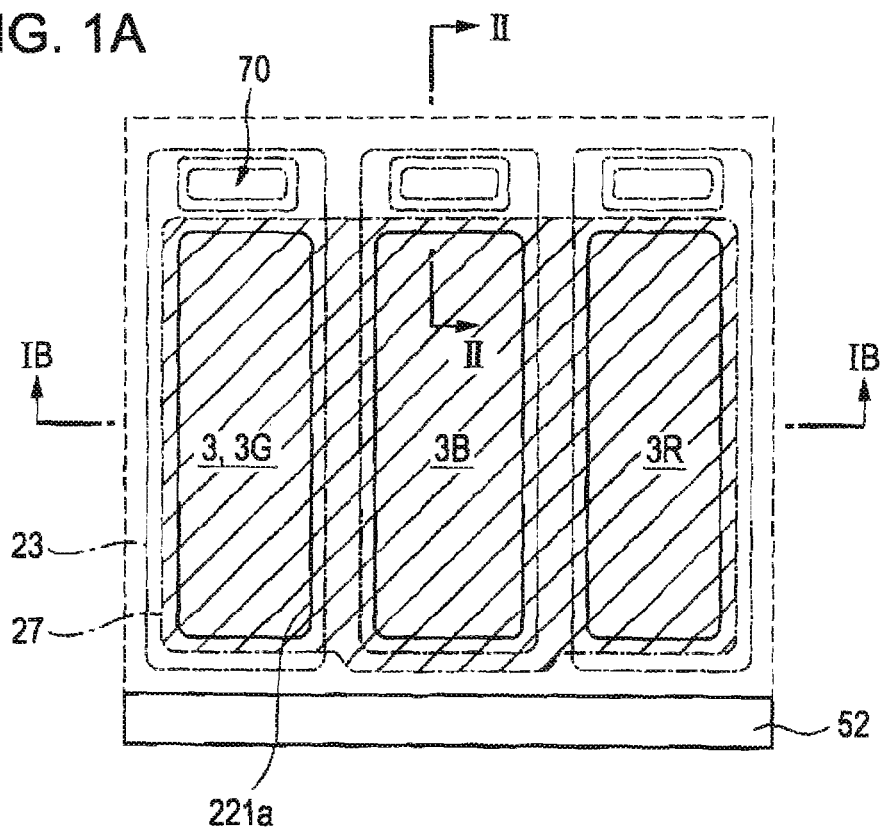
FIG. 1A is a plan view of a light-emitting device according to a first embodiment of the present invention.
Figure 1B:
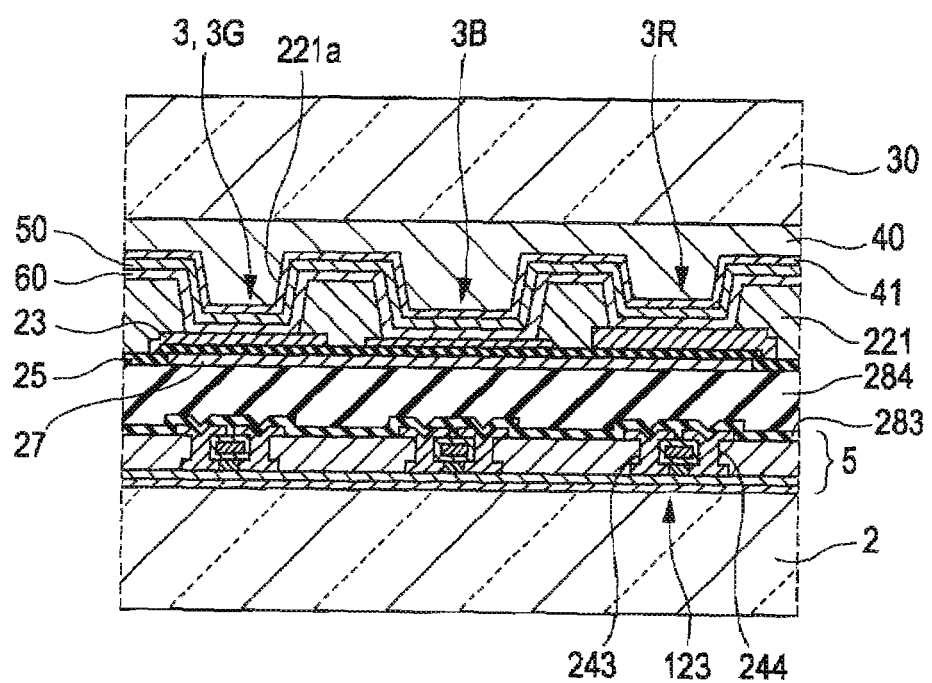
FIG. 1B is a sectional view of the light-emitting device taken along the line IB-IB of FIG. 1A.
Figure 2:
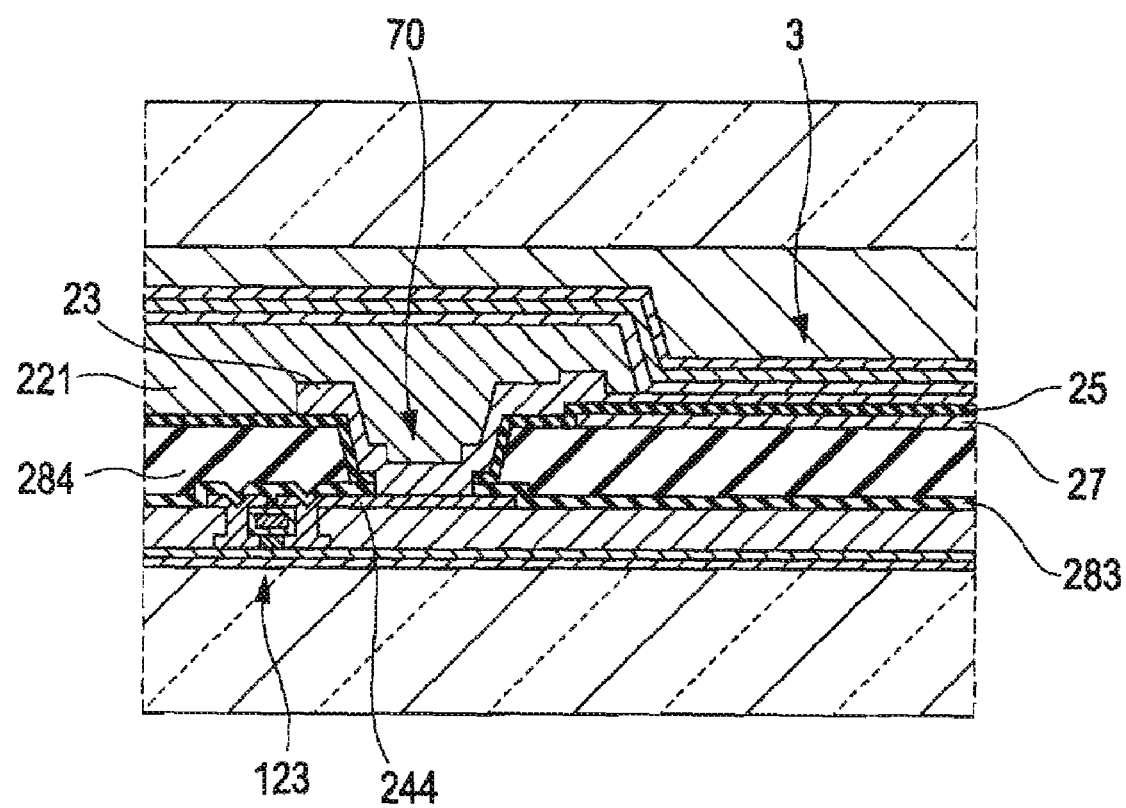
FIG. 2 is a sectional view of the light-emitting device taken along the line II-II of FIG. 1A.

FIG. 1A is a plan view of a light-emitting device according to a first embodiment of the present invention. FIG. 1B is a sectional view of the light-emitting device taken along the line IB-IB of FIG. 1A. FIG. 2 is a sectional view of the light-emitting device taken along the line II-II of FIG. 1A. As shown in FIG. 1B, the light-emitting device is a top emission type of organic EL device having optical resonant structures. The light-emitting device includes an organic insulating layer 284, reflective layers 27, an inorganic insulating layer 25, and light-emitting elements 3. The light-emitting elements 3 are arranged in array and each reflective layer 27 overlaps a group of the light-emitting elements 3 when viewed from above. In particular, the light-emitting elements 3 are classified into green light-emitting elements 3G, blue light-emitting elements 3B, and red light-emitting elements 3R; each green light-emitting element 3G, blue light-emitting element 3B, and red light-emitting element 3R are arranged in that order; and each reflective layer overlaps a group of the green, blue, and red light-emitting elements 3G, 3B, and 3R when viewed from above.

In the light-emitting device, light emitted from a light-emitting layer 60 is extracted through a sealing substrate 30 as shown in FIG. 1B; therefore, an element substrate 2 may be made of a transparent or opaque material. Examples of the transparent material include glass, quartz, and resin. In particular, glass is preferably used.

A driving circuit section 5 including driving TFTs 123, which may be referred to as switching elements, for driving the light-emitting elements 3 is disposed above the element substrate 2. Alternatively, a semiconductor element or an IC chip including a driving circuit may be mounted on the element substrate 2 instead of the driving circuit section A first interlayer insulating layer 283 principally made of silicon dioxide ($SiO_2$) overlies the driving circuit section 5. The organic insulating layer 284, which may be referred to as a planarization layer, overlies the first interlayer insulating layer 283 and is principally made of a photosensitive insulating resin, such as an acrylic resin or a polyimide resin, having heat resistance. The organic insulating layer 284 is necessary to conceal irregularities due to the driving TFTs 123, source electrodes 243, drain electrodes 244, and the like.

The reflective layers 27 described below in detail are arranged on the organic insulating layer 284. The inorganic insulating layer 25, which may be referred to as a passivation layer or an etching protection layer, overlies the reflective layers 27 and is made of $SiO_2$ or silicon nitride (SiN). The inorganic insulating layer 25 has a function of electrically isolating the reflective layers 27 from the pixel electrodes 23, that is, a function of preventing the electrical conduction between the reflective layers 27 and the pixel electrodes 23. The inorganic insulating layer 25 also has a function of protecting the reflective layers 27 and the organic insulating layer 284 from an etching solution for forming the pixel electrodes 23 by patterning. The organic insulating layer 284 readily absorbs moisture and the light-emitting elements 3 are readily degraded by moisture. Therefore, the inorganic insulating layer 25 further has a function of preventing moisture from being diffused into the light-emitting elements 3 from the organic insulating layer 284.

The pixel electrodes 23 are arranged on the inorganic insulating layer 25. As shown in FIG. 1A, the pixel electrodes 23 have an area greater than that of regions for forming the light-emitting elements 3. This allows the light-emitting device to have high aperture ratio. The pixel electrodes 23 are arranged in a matrix pattern. Contact holes 70, which may be referred to as through holes, are located close to the light-emitting elements 3 and extend through the organic insulating layer 284. As shown in FIG. 2A, the pixel electrodes 23 are electrically connected to the drain electrodes 244 of the driving TFTs 4 with the contact holes 70.

With reference back to FIG. 1B, the pixel electrodes 23 are surrounded by organic partitions 221 made of an organic insulating material such as polyimide. Portions of the organic partitions 221 are disposed on end portions of the pixel electrodes 23. The organic partitions 221 have open zones 221a. A plurality of functional layers extend over the walls and bottoms of the open zones 221a, thereby forming the light-emitting elements 3. That is, the open zones 221a define the regions for forming the light-emitting elements 3.

The light-emitting elements 3 include the pixel electrodes 23 serving as anodes, portions of the light-emitting layer 60 containing an organic EL substance, and portions of a common electrode 50 serving as a cathode, the pixel electrodes 23, the light-emitting layer 60, and the common electrode 50 being arranged in that order. The light-emitting elements 3 serve as sub-pixels corresponding to image display units. One pixel consists of each green light-emitting element 3G, blue light-emitting element 3B, and red light-emitting element 3R.

The pixel electrodes 23 are made of a transparent conductive material such as indium tin oxide (ITO).

A hole injection layer for injecting and transporting holes, supplied from the pixel electrodes 23, into the light-emitting layer 60 may be placed between the pixel electrodes 23 and the light-emitting layer 60. A material for forming the hole injection layer is preferably a 3,4-polyethylenedioxythiophene/polystyrene sulfonic acid (PEDOT/PSS) dispersion. The dispersion is prepared by dispersing 3,4-polyethylenedioxythiophene in polystyrene sulfonic acid serving as a dispersion medium. Water is preferably added to the dispersion.

The material for forming hole injection layer is not limited to the above dispersion and may be a dispersion prepared by dispersing the following polymer in an appropriate dispersion medium such as polystyrene sulfonic acid described above: polystyrene, polypyrrole, polyaniline, polyacetylene, or its derivative. Alternatively, the hole injection layer can be formed by, for example, a vacuum vapor deposition process using a low-molecular-weight material. Examples of the low-molecular-weight material include aromatic amines such as 4,4'-bis(N-(naphthyl)-N-phenyl-amino)biphenyl (α-NPD) and 4,4',4''-tris(N-3-methylphenyl-N-phenyl-amino)triphenylamine (MTDATA), phthalocyanines such as copper phthalocyanine (CuPc), and derivatives of these compounds.

A known luminescent material emitting phosphorescent or fluorescent, light can be used to form the light-emitting layer 60. Preferable examples of the luminescent material include polyfluorenes (PFs), polyparaphenylene vinylenes (PPVs), polyphenylenes (PPs), polyparaphenylenes (PPPs), polyvinylcarbazoles (PVKs), polythiophenes, and polysilanes such as polymethylphenylsilane (PMPS). These polymers may be doped with a high-molecular-weight dye such as a perylene dye, a coumarin dye, or a rhodamine dye or a low-molecular-weight dye such as rubrene, perylene, 9,10-diphenylanthracene, tetraphenylbutadiene, Nile red, coumarin-6, or quinacridone. Alternatively, the light-emitting layer 60 can be formed from a low-molecular-weight material, such as carbazole (CBP), doped with the low-molecular-weight dye. The light-emitting layer 60 may include an electron transport sublayer containing tris(8-quinolinolato) aluminum (Alq3).

The common electrode 50 extends over the element substrate 2. The common electrode 50 is made of a material containing a component, such as magnesium (Mg), lithium (Li), or calcium (Ca), having low work function. The common electrode 50 preferably includes a light-transmissive conductive thin-film made of Mg—Ag in which the ratio of Mg to Ag is 10:1. Alternatively, the common electrode 50 may include a Mg—Ag—Al thin-film, a Li—Al thin-film, or a Li—F—Al thin-film. The common electrode 50 may include one of these alloy thin-films and a transparent conductive thin-film made of ITO or the like in combination.

Since the light-emitting device is such a top emission type as described above, the common electrode 50 has a thin-film shape such that high light extraction efficiency can be achieved; hence, the common electrode 50 is low in conductivity. As shown in FIG. 1A, an auxiliary electrode 52 that is line-shaped is disposed on the common electrode 50. The auxiliary electrode 52 supplements the conductivity of the common electrode 50 and is made of a metal material, such as Al, Au, or Ag, having high conductivity. In order to prevent a reduction in aperture, the auxiliary electrode 52 is disposed around the sub-pixels. The auxiliary electrode 52 may have a light-shielding function. The auxiliary electrode 52 extends transversely over the element substrate 2. Alternatively, a plurality of auxiliary electrodes extending in one or two directions may be arranged on the common electrode 50 in a striped pattern or a lattice pattern, respectively.

With reference back to FIG. 1B, an inorganic sealing layer 41 made of $SiO_2$ or the like lies on the common electrode 50. A sealing substrate 30 made of a transparent material such as glass is joined to the inorganic sealing layer 41 with an adhesive layer 40 disposed therebetween. The inorganic sealing layer 41 protects the light-emitting elements 3 from moisture, oxygen, and the like passing through the sealing substrate 30. Moisture, oxygen, and the like may be captured as follows: a sealing cap is provided above the element substrate 2 so as to entirely cover the common electrode 50; end portions of the sealing cap are fixed to those of the element substrate 2; and a getter absorbing moisture, oxygen, and the like is placed inside the sealing cap.

In the light-emitting device, image signals supplied from outside are applied to the pixel electrodes 23 with the driving TFTs 123 at predetermined timing. Holes injected from the pixel electrodes 23 and electrons injected from the common electrode 50 are recombined with each other in the light-emitting layer 60, whereby light with specific wavelengths is emitted. Since the holes are injected through junctions between the light-emitting layer 60 and the pixel electrodes 23, the junctions therebetween function as light-emitting sections. Lights emitted from the light-emitting sections toward the common electrode 50 are extracted through the sealing substrate 30. Lights emitted therefrom toward the pixel electrodes 23 are reflected by the reflective layers 27 and then extracted through the sealing substrate 30. This allows an image to be displayed through the sealing substrate 30.

The common electrode 50 shown in FIG. 1B functions as a transflective layer that allows a portion of light emitted from the light-emitting layer 60 to pass therethrough and reflects the rest of the light toward the reflective layers 27. In usual, a light-transmissive conductive layer such as a metal thin-film has a reflectance of 10% to 50% when this layer is in contact with the light-emitting layer 60. Therefore, the common electrode 50 functions as such a transflective layer when the common electrode 50 includes the light-transmissive conductive layer. Since the light-emitting layer 60 is sandwiched between the common electrode 50 having such a transflective function and the reflective layers 27, light emitted from the light-emitting layer 60 is resonated between the common electrode 50 and the reflective layers 27, that is, the light-emitting elements 3 have respective optical resonant structures. In the light-emitting device, light emitted from the light-emitting layer 60 travels between the reflective layers 27 and the common electrode 50; hence, only components of the light that have resonant wavelengths corresponding to the travel distances thereof are extracted from the light-emitting device in an amplified manner. This allows light having high brightness and sharp spectrum to be extracted.

Lights emitted from the green, blue, and red light-emitting elements 3G, 3B, and 3R have wavelengths equal to the resonant wavelengths of the optical resonant structures of the green, blue, and red light-emitting elements 3G, 3B, and 3R, that is, the wavelengths corresponding to the optical distances between the reflective layers 27 and the common electrode 50. The optical distances therebetween are equal to the sums of the optical distances of the components disposed between the reflective layers 27 and the common electrode 50. The optical distance of each component disposed therebetween depends on the product, of the thickness and refractive index of this component. The lights emitted from the green, blue, and red light-emitting elements 3G, 3B, and 3R have different colors and therefore the optical resonant structures of the green, blue, and red light-emitting elements 3G, 3B, and 3R have different resonant wavelengths. In this embodiment, these resonant wavelengths depend on the thicknesses of the pixel electrodes 23 located close to the element substrate 2. The pixel electrodes 23 placed in the red light-emitting elements 3R emitting light with the longest wavelength have the greatest thickness. The pixel electrodes 23 placed in the green light-emitting elements 3G have a thickness less than that of the pixel electrodes 23 placed in the red light-emitting elements 3R. The pixel electrodes 23 placed in the blue light-emitting elements 3B have a thickness less than that, of the electrodes 23 placed in the green light-emitting elements 3G.

Since the colors of the lights emitted from the green, blue, and red light-emitting elements 3G, 3B, and 3R depend on the thicknesses of the pixel electrodes 23, the light-emitting layer 60 need not contain compounds that are different from each other depending on the green, blue, and red light-emitting elements 3G, 3B, and 3R. Therefore, the light-emitting layer 60 may contain a single luminescent compound emitting white light, that is, the green, blue, and red light-emitting elements 3G, 3B, and 3R may commonly contain such a luminescent compound. In this case, the green, blue, and red light-emitting elements 3G, 3B, and 3R have the same life; hence, the color texture of a displayed image does not vary even if the light-emitting device is used for a long period. Since lights other than those having specific wavelengths are not used to display an image, luminescent compounds each suitable for the corresponding sub-pixels are preferably used to achieve high light utilization efficiency. That is, if a green, a blue, and a red luminescent compound are contained in the green, blue, and red light-emitting elements 3G, 3B, and 3R, respectively, and the optical distances of the optical resonant structures are adjusted to the peak wavelengths of these luminescent compounds, high light utilization efficiency can be achieved and a bright image can be displayed.

With reference to FIG. 1B, the reflective layers 27 are arranged on the organic insulating layer 284. The reflective layers 27 are preferably made of a metal material, such as silver (Ag) or aluminum (Al), having high reflectance. As shown in FIG. 1A, each reflective layer 27 overlaps a group of each green light-emitting element 3G, blue light-emitting element 3B, and red light-emitting element 3R when viewed from above, that is, when viewed in the direction of the normal to the element substrate 2. That is, the reflective layer 27 has an area greater than that of a region for forming the green, blue, and red light-emitting elements 3G, 3B, and 3R. End portions of the reflective layers 27 may be disposed inside or outside the pixel electrodes 23. Alternatively, the end portions of the reflective layers 27 may be disposed on the organic insulating layer 284 as shown in FIG. 2 or may extend on the walls and bottoms of the contact holes 70.

With reference back to FIG. 1A, in this embodiment, each blue light-emitting element 3B is sandwiched between each green light-emitting element 3G and blue light-emitting element 3B and each reflective layer 27 overlaps a group of the green, blue, and red light-emitting elements 3G, 3B, and 3R when viewed from above. The green, blue, and red light-emitting elements 3G, 3B, and 3R each serve as a sub-pixel and one pixel consists of three sub-pixels. Therefore, pixels have the respective reflective layers 27. The pixels may commonly have one reflective layer 27.

Figure 8A:
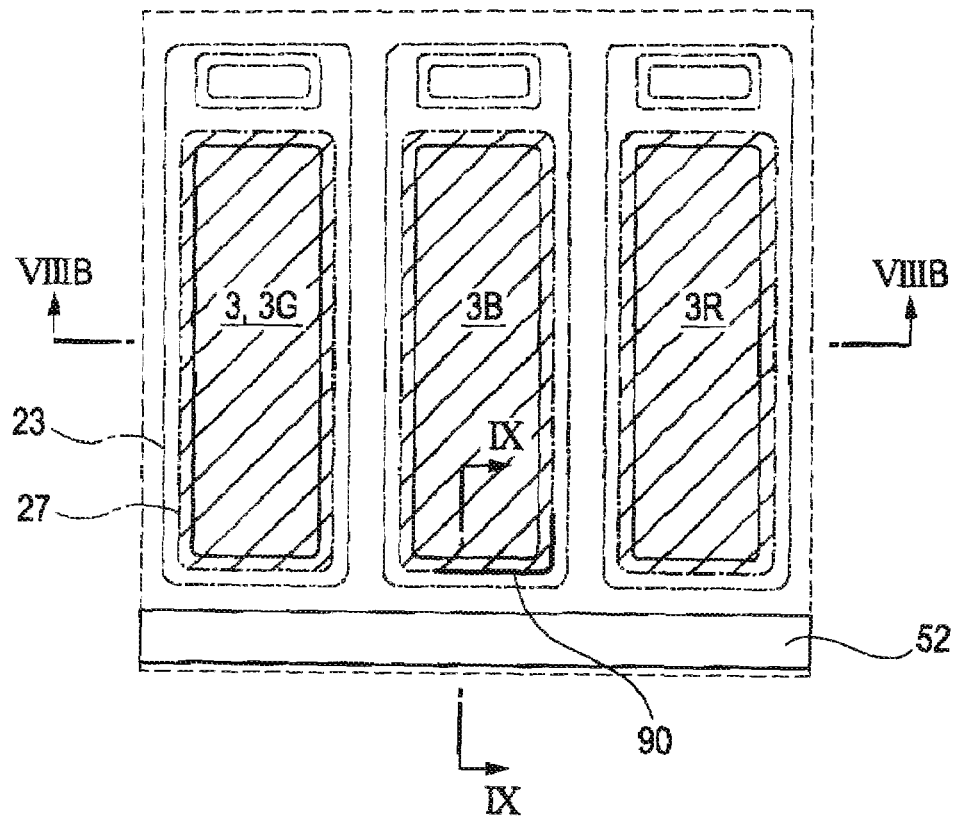
FIG. 8A is a plan view of a conventional light-emitting device.
Figure 8B:
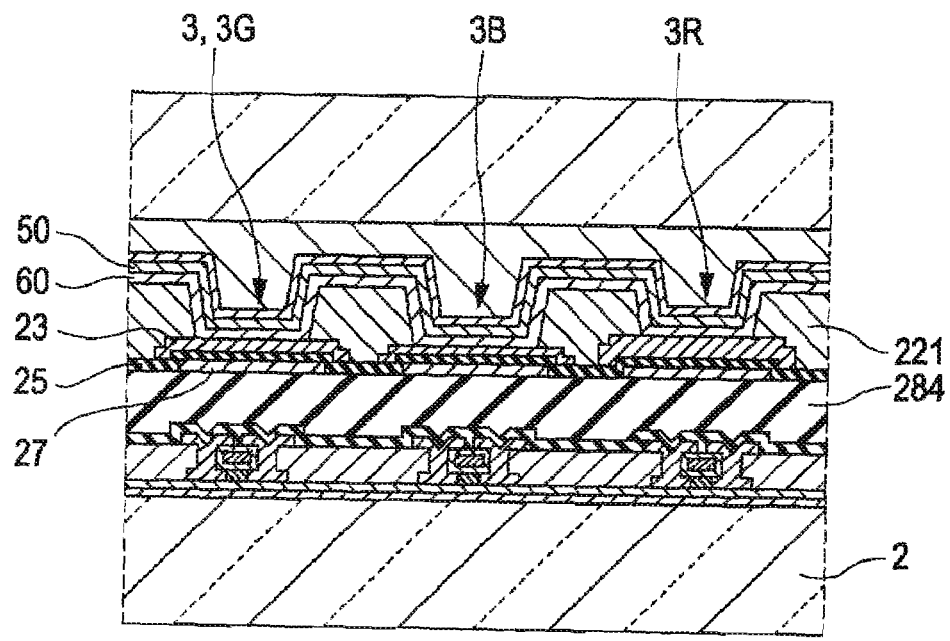
FIG. 8B is a sectional view of the conventional light-emitting device taken along the line VIIIB-VIIIB of FIG. 8A.
Figure 9:
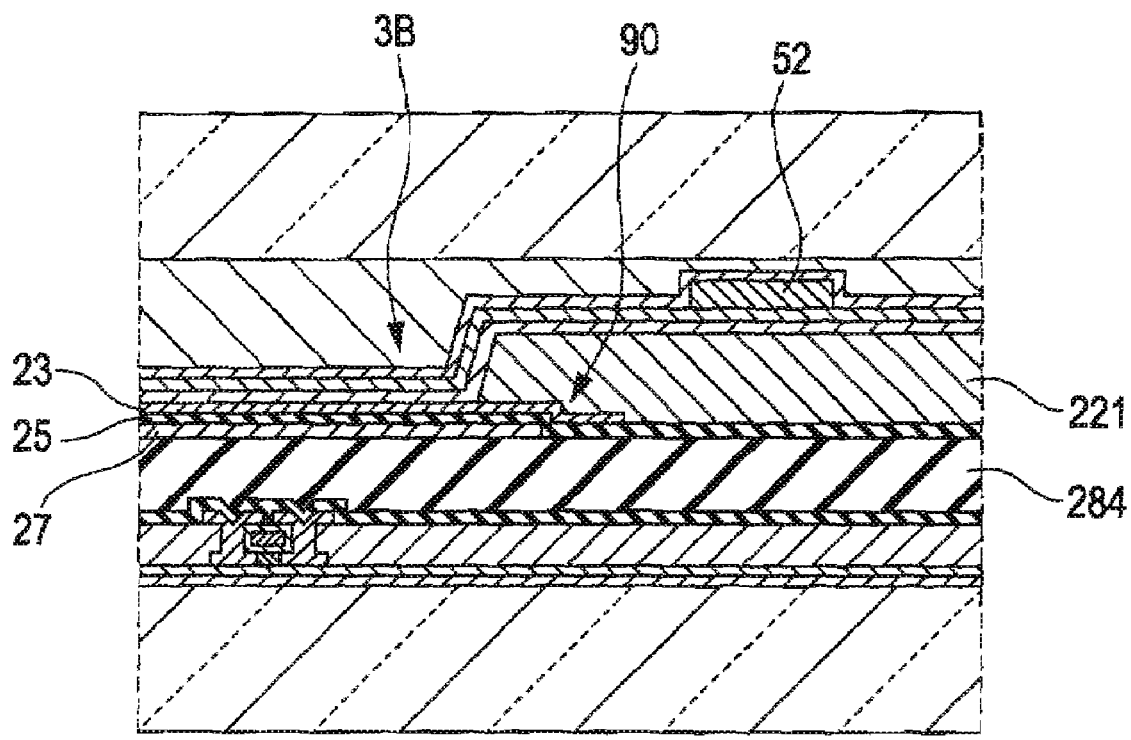
FIG. 9 is a sectional view of the conventional light-emitting device taken along the line IX-IX of FIG. 8A.

On the other hand, those green, blue, and red light-emitting elements 3G, 3B, and 3R included in the conventional light-emitting device shown in FIG. 8B each have one reflective layer 27. As shown in FIG. 8A, in the conventional light-emitting device, the crack 90 is initiated at a corner of one of those reflective layers 27 to propagate along end portions of this reflective layer 27 in some cases. With reference to FIG. 9, the crack 90 propagates through that inorganic insulating layer 25 and one of those pixel electrodes 23. The crack 90 is probably caused because the following stresses are concentrated on the end portions of this reflective layer 27: residual stresses created during the formation of that organic insulating layer 284, those reflective layers 27, that inorganic insulating layer 25, and those pixel electrodes 23; thermal stresses caused by differences in thermal expansion between these layers and electrodes; and other stresses.

Each reflective layer 27 of the light-emitting device of this embodiment overlaps a group of the green, blue, and red light-emitting elements 3G, 3B, and 3R when viewed from above as described above. In other words, the reflective layer 27 extends over the three green, blue, and red light-emitting elements 3G, 3B, and 3R. This leads to a reduction in the number of the corners and end portions of the reflective layers 27; hence, cracks can be prevented from being caused in the inorganic insulating layer 25 or the pixel electrodes 23. Furthermore, moisture contained in the organic insulating layer 284 can be prevented from being diffused into the light-emitting elements 3 through the cracks. Therefore, defects such as dark spots can be prevented from arising. Furthermore, a reduction in the number of the end portions of the reflective layers 27 leads to an increase in aperture ratio.

In the conventional light-emitting device, the dark spots are frequently formed particularly in those blue light-emitting elements 3B. This is because the pixel electrodes 23 of those blue light-emitting elements 3B have the smallest thickness and therefore have the lowest cracking resistance.

However, each reflective layer 27 of the light-emitting device of this embodiment overlaps the three green, blue, and red light-emitting elements 3G, 3B, and 3R when viewed from above as described above. Therefore, this blue light-emitting element 3B is not located close to the corners of the reflective layer 27; hence, cracks can be prevented from being formed in the pixel electrode 23 placed in this blue light-emitting element 3B. This prevents the formation of the dark spots.

Second Embodiment

Figure 3A:
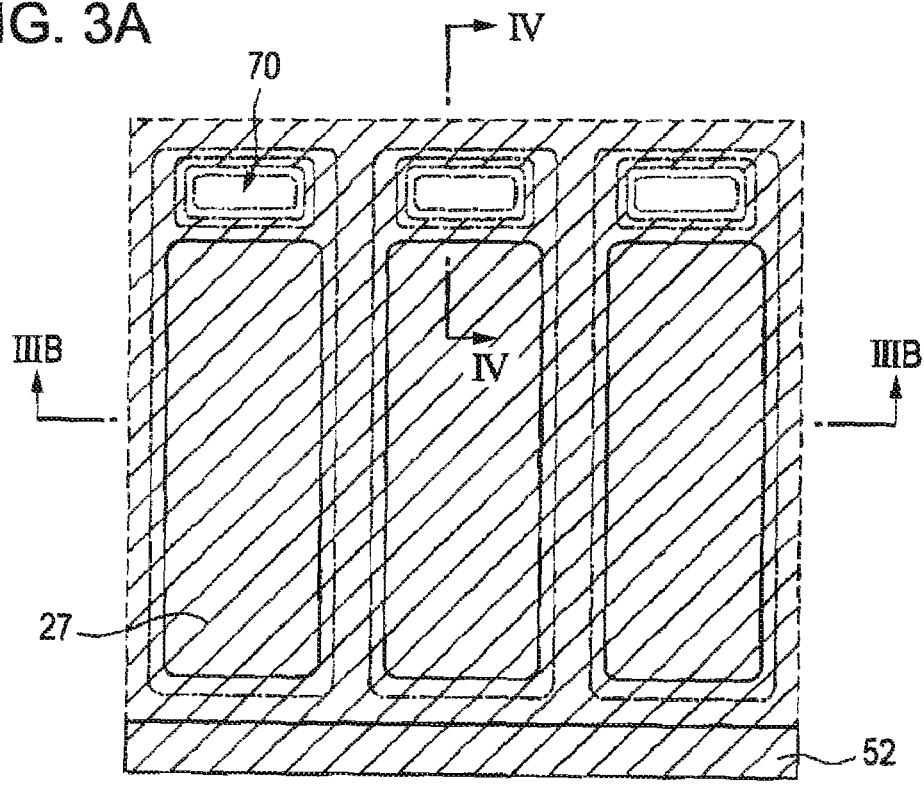
FIG. 3A is a plan view of a light-emitting device according to a second embodiment of the present invention.
Figure 3B:
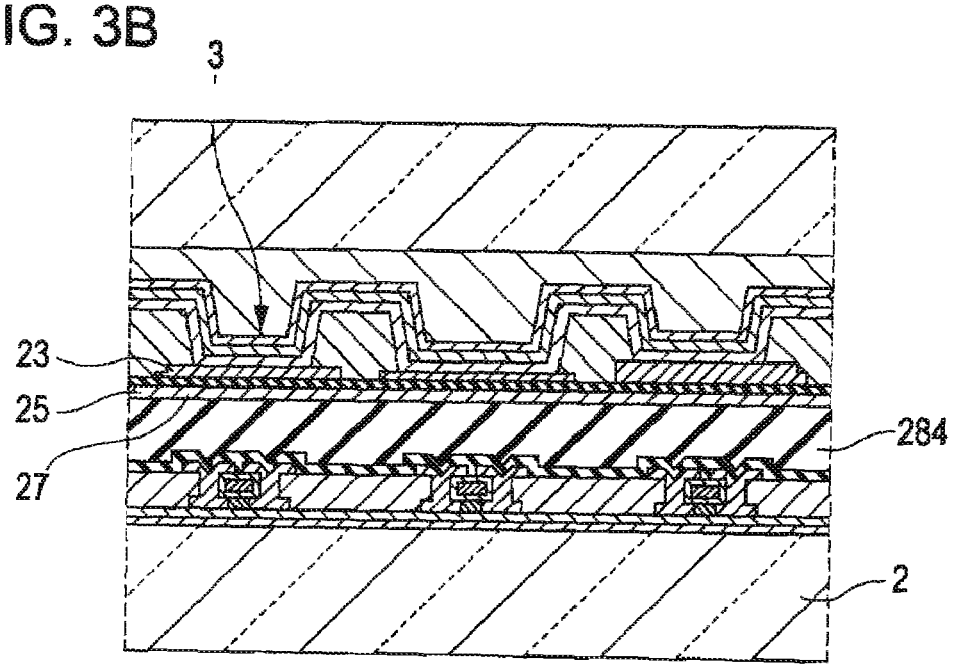
FIG. 3B is a sectional view of the light-emitting device taken along the line IIIB-IIIB of FIG. 3A.
Figure 4:
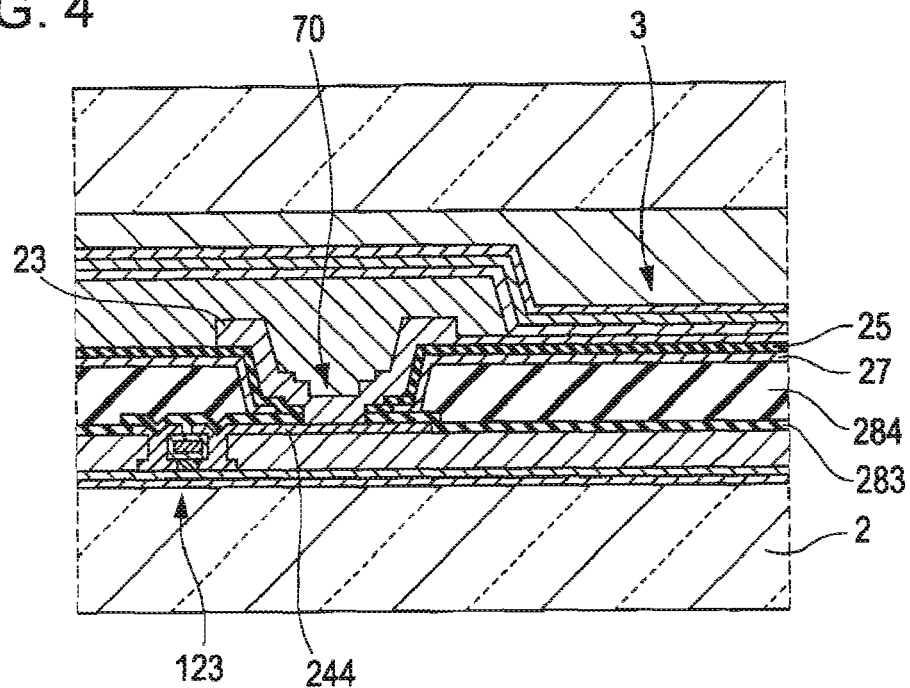
FIG. 4 is a sectional view of the light-emitting device taken along the line IV-IV of FIG. 3A.

FIG. 3A is a plan view of a light-emitting device according to a second embodiment of the present invention. FIG. 3B is a sectional view of the light-emitting device taken along the line IIIB-IIIB of FIG. 3A. FIG. 4 is a sectional view of the light-emitting device taken along the line IV-IV of FIG. 3A. The light-emitting device of this embodiment includes a reflective layer 27 covering substantially an entire surface of an element substrate 2 and therefore is different from the light-emitting device of the first embodiment that includes that reflective layers 27 provided to the respective pixels. The same components as those described in the first embodiment will not be described in detail in this embodiment.

The reflective layer 27 extends over an organic insulating layer 284 as shown in FIG. 3B and also extends over the walls and bottoms of contact holes 70 as shown in FIG. 4. A first interlayer insulating layer 283 extends below the bottoms of the contact holes 70. Openings extend through the reflective layer 27 and the first interlayer insulating layer 283 to electrically connect pixel electrodes 23 to drain electrodes 244. Therefore, the reflective layer 27 has end portions located at the bottoms of the contact holes 70. The end portions of the reflective layer 27 are spaced from the walls of the contact holes 70.

In this embodiment, since the reflective layer 27 covers substantially an entire surface of the element substrate 2, an inorganic insulating layer 25 is preferably formed by an anodic oxidation process using the reflective layer 27 as an electrode. In particular, the reflective layer 27 which is preferably made of an Al-containing material is connected to an anode and a platinum electrode is connected to a cathode. The reflective layer 27 and the platinum electrode are immersed in an aqueous sulfuric acid solution with a concentration of about 5% such that the reflective layer 27 is opposed to the platinum electrode. Oxidation is then performed for about 20 minutes by applying a voltage of about 30 V between the reflective layer 27 and the platinum electrode. This allows an aluminum oxide layer having micropores to be formed over the reflective layer 27 in a self-assembled manner. This configuration is effective in reducing the excessively high directivity of lights extracted from optical resonant structures. Alternatively, a flat aluminum oxide layer having no micropores may be formed on the reflective layer 27 using an organic acid.

As described above, the anodic oxidation process is useful in forming the inorganic insulating layer 25 over the reflective layer 27 such that the inorganic insulating layer 25 is dense and have very few defects. Furthermore, the anodic oxidation process is effective in reducing the manufacturing cost of the inorganic insulating layer.

In this embodiment, the number of the end portions of the reflective layer 27 is small; hence, cracks can be prevented from being formed in the inorganic insulating layer 25. Furthermore, the end portions of the reflective layer 27 are not arranged on the organic insulating layer 284 but are arranged on the first interlayer insulating layer 283. This prevents the formation of the cracks. Since the reflective layer 27 which is made of a metal material is sandwiched between the organic insulating layer 284, which is soft, and the inorganic insulating layer 25, which is hard, stresses created at the interfaces between these layers are small and therefore these layers can be prevented from being peeled off from each other. Even if any cracks are initiated at the end portions of the reflective layer 27 to propagate to the inorganic insulating layer 25, moisture contained in the organic insulating layer 284 is not diffused into light-emitting elements 3 through these cracks because the end portions of the reflective layer 27 are spaced from the organic insulating layer 284. Therefore, defects such as dark spots can be prevented from arising.

Furthermore, in this embodiment, the reflective layer 27 covers driving TFTs 123; hence, the driving TFTs 123 can be shielded from light. This prevents optical leakage currents from being generated in the driving TFTs 123.

Third embodiment

Figure 5:
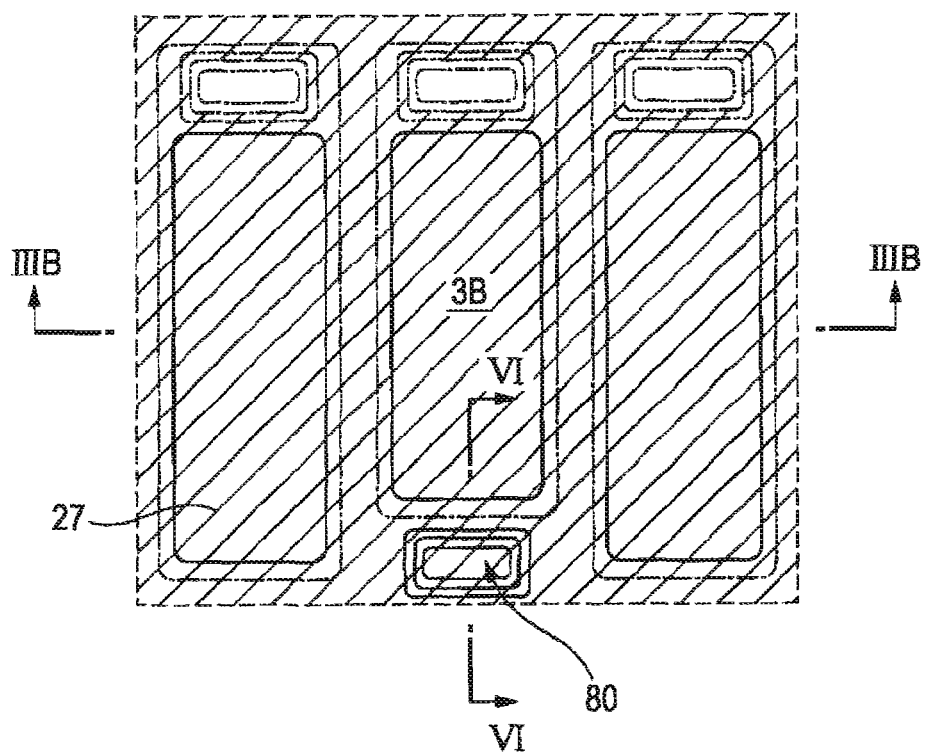
FIG. 5 is a plan view of a light-emitting device according to a third embodiment of the present invention.
Figure 6:
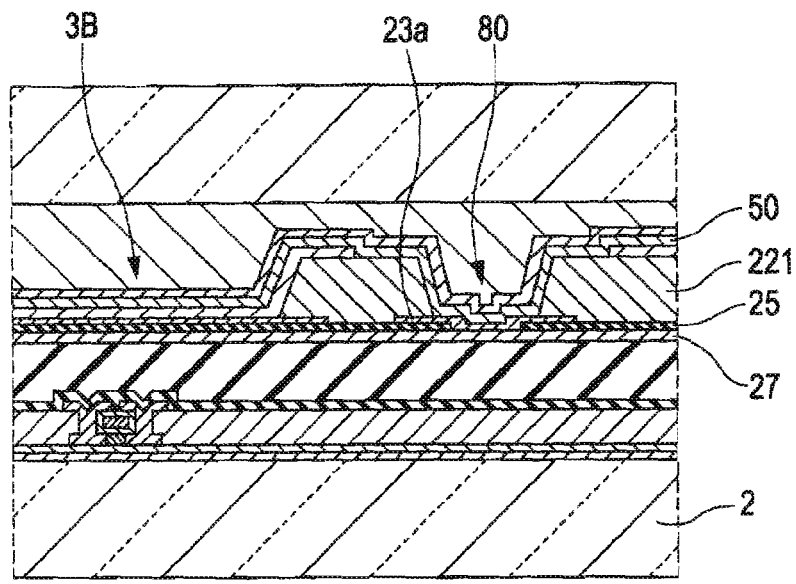
FIG. 6 is a sectional view of the light-emitting device taken along the line VI-VI of FIG. 5.

FIG. 5 is a plan view of a light-emitting device according to a third embodiment of the present invention. FIG. 6 is a sectional view of the light-emitting device taken along the line VI-VI of FIG. 5. A sectional view taken along the line IIIB-IIIB of FIG. 5 is substantially the same as FIG. 3A. The light-emitting device of this embodiment is different from the light-emitting device of the second embodiment in that the light-emitting device of this embodiment includes a reflective layer 27 and a common electrode 50 electrically connected thereto as shown in FIG. 6. The same components as those described in the first or second embodiment will not be described in detail in this embodiment.

In this embodiment, contact holes 80 extending through organic partitions 221 are located adjacent to regions for forming blue light-emitting elements 3B as shown in FIG. 5. The contact holes 80 may be arranged close to end portions of other light-emitting elements or end portions of all light-emitting elements. With reference to FIG. 6, the reflective layer 2 7 extends over an element substrate 2 and portions of the reflective layer 27 are exposed at the bottoms of the contact holes 80. The common electrode 50 extends over the organic partitions 221 and the walls and bottoms of the contact holes 80 and is electrically connected to the reflective layer 27. A conductive member 23a may be disposed between the common electrode 50 and the reflective layer 27.

As described above, the reflective layers 27 extends over the element substrate 2 and is electrically connected to the common electrode 50. This allows the reflective layers 27 to function as an auxiliary electrode for the common electrode 50. Therefore, no auxiliary electrode needs to be formed on the common electrode 50. This leads to a reduction in manufacturing cost and an increase in aperture ratio.

Fourth Embodiment

A fourth embodiment of the present invention provides an electronic apparatus including the light-emitting device according to any one of the above embodiments. The electronic apparatus will now be described with reference to FIG. 7.

Figure 7:
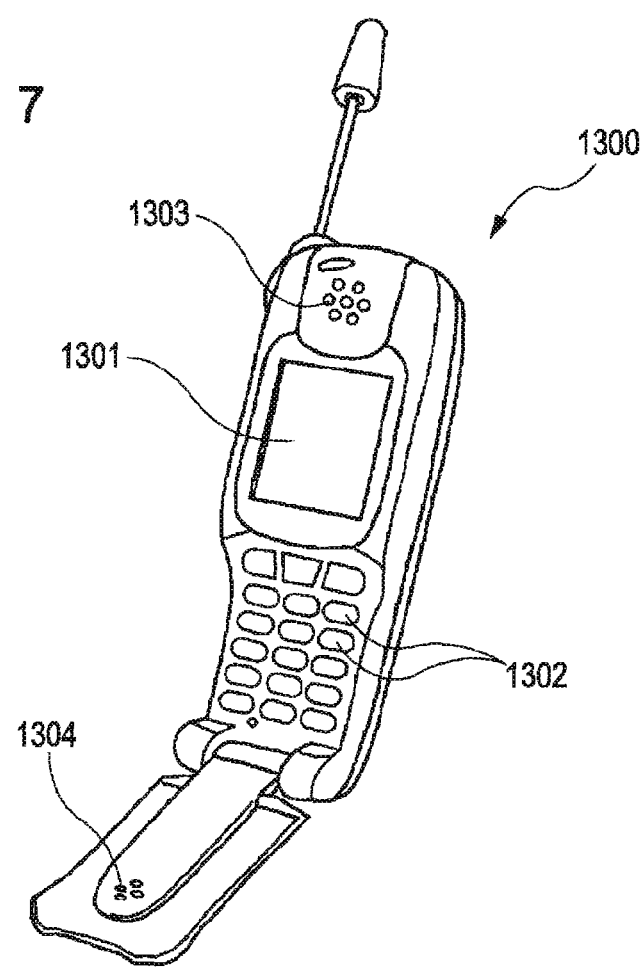
FIG. 7 is a perspective view of a mobile phone.

FIG. 7 is a perspective view of a mobile phone that is an example of the electronic apparatus. With reference to FIG. 7, the mobile phone is represented by reference numeral 1300 and includes a plurality of operation buttons 1302, an earpiece 1303, a mouthpiece 1304, and a display section 1301 including the light-emitting device. Since dark spots can be prevented from being formed in the light-emitting device, the mobile phone has high reliability.

The electronic apparatus is not limited to the mobile phone. Examples of the electronic apparatus include digital cameras, personal computers, televisions, portable televisions, viewfinder-type or direct view-type video tape recorders, personal data assistants (PDAs), portable game machines, pagers, electronic notebooks, portable electronic calculators, watches, word processors, work stations, video phones, point-of-sale (POS) terminals, apparatuses including touch panels, vehicle-mounted audio systems, instruments for vehicle use, vehicle-mounted displays such as car navigation systems, and optical printer heads.

The scope of the present invention is not limited to the above embodiments. Various modifications may be made to the above embodiments within the scope of the present invention. The materials and structures described in detail in the embodiments are merely examples and may be modified. A light-emitting device according to an embodiment of the present invention can be used for display units, having a micro-cavity structure, for top emission-type organic EL apparatuses; reflective or transflective liquid crystal apparatuses; and other apparatuses.

The entire disclosure of Japanese Patent Application No. 2006-005770, filed Jan. 13, 2006 is expressly incorporated by reference herein.

What is claimed is:

1. A light-emitting device comprising:
an organic insulating layer lying above a face of a substrate;
reflective, layers lying on a face of the organic insulating layer;
an inorganic insulating layer lying over the reflective layers; and
light-emitting elements arranged above the reflective layers with the inorganic insulating layer disposed therebetween,
wherein the light-emitting elements are arranged in array and each reflective layer overlaps a group of the light-emitting elements when viewed from above.

2. The light-emitting device according to claim 1, wherein the light-emitting elements emit different color lights, one of the light-emitting elements of the group emits a blue light, and the other light-emitting elements of the group emit different color lights other than the blue light and are each arranged on both sides of this light-emitting element.

3. The light-emitting device according to claim 1, wherein the reflective layers are arranged over the face of the organic insulating layer.

4. The light-emitting device according to claim 3, wherein the organic insulating layer has contact holes extending therethrough and the reflective layers extend over the walls of the contact holes.

5. The light-emitting device according to claim 3, wherein the reflective layers have openings extending from the contact holes through the reflective layers and the inorganic insulating layer.

6. The light-emitting device according to claim 3, wherein the inorganic insulating layer is formed by an anodic oxidation process using the reflective layers as electrodes.

7. The light-emitting device according to claim 3, further comprising a common electrode shared by the light-emitting elements, wherein the reflective layers are electrically connected to the common electrode.

8. The light-emitting device according to claim 3, wherein the light-emitting elements include a light-emitting layer containing an organic substance.

9. An electronic apparatus comprising the light-emitting device according to claim 1.

10. A light-emitting device comprising:
a substrate;
light-emitting layers;
an organic insulating layer being disposed between the substrate and the light-emitting layers;
a reflective layer being disposed between the organic insulating layer and the light-emitting layers; and
an inorganic insulating layer being disposed between the reflective layer and the light-emitting layers;
wherein the reflective layer overlaps the light-emitting layers in plan view.

11. The light-emitting device according to claim 10, further comprising a common electrode shared by the light-emitting layers, wherein the reflective layer is electrically connected to the common electrode.

12. The light-emitting device according to claim 11, the light-emitting layers are disposed between the common electrode and the inorganic insulating layer.

13. The light-emitting device according to claim 10, wherein the organic insulating layer has contact holes extending therethrough and the reflective layer extend over walls of the contact holes.

14. The light-emitting device according to claim 10, wherein the light-emitting layers emit different color lights, one of the light-emitting layers emits a red light, another one of the light-emitting layers emits a green light and another one of the light-emitting layers emits a blue light.

15. A light-emitting device comprising:
a substrate;
light-emitting elements;
an organic insulating layer being disposed between the substrate and the light-emitting elements;
a reflective layer being disposed between the organic insulating layer and the light-emitting elements; and
an inorganic insulating layer being disposed between the reflective layer and the light-emitting elements;
wherein the reflective layer overlaps the light-emitting elements in plan view.

16. The light-emitting device according to claim 15, further comprising a common electrode shared by the light-emitting layers, wherein the reflective layer is electrically connected to the common electrode.

17. The light-emitting device according to claim 15, wherein the organic insulating layer has contact holes extending therethrough and the reflective layer extends over walls of the contact holes.

18. The light-emitting device according to claim 15, wherein the light-emitting elements have a first light-emitting element and adjacent light-emitting elements that are adjacent to the first light-emitting element, the first light-emitting element and the adjacent light-emitting elements emit a same color light.

* * * * *